United States Patent
Dalton et al.

(10) Patent No.: US 7,546,670 B2
(45) Date of Patent: Jun. 16, 2009

(54) METHOD FOR PRODUCING THERMALLY MATCHED PROBE ASSEMBLY

(75) Inventors: Timothy J. Dalton, Ridgefield, CT (US);
Simon M. Karecki, Brooklyn, NY (US);
Anna Karecki, legal representative, Brooklyn, NY (US); Samuel R. McKnight, New Paltz, NY (US);
George F. Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 11/429,419

(22) Filed: May 5, 2006

(65) Prior Publication Data
US 2007/0257689 A1  Nov. 8, 2007

(51) Int. Cl.
*B23P 13/04*     (2006.01)
*H01R 43/00*     (2006.01)
(52) U.S. Cl. ............................. 29/557; 29/825; 29/874; 29/876; 29/881; 324/754; 324/761
(58) Field of Classification Search .................. 29/874, 29/876, 881, 882, 557; 324/754, 751
See application file for complete search history.

(56) References Cited

U.S. PATENT DOCUMENTS

| | | | | |
|---|---|---|---|---|
| 6,104,596 A | * | 8/2000 | Hausmann | 361/234 |
| 6,140,828 A | * | 10/2000 | Iino et al. | 324/758 |
| 6,642,728 B1 | * | 11/2003 | Kudo et al. | 324/754 |
| 6,768,331 B2 | * | 7/2004 | Longson et al. | 324/761 |
| 2002/0179223 A1 | * | 12/2002 | Boek et al. | 156/82 |
| 2004/0088855 A1 | * | 5/2004 | Akram | 29/840 |

* cited by examiner

Primary Examiner—C. J Arbes
(74) Attorney, Agent, or Firm—Daniel P. Morris; David Aker

(57) ABSTRACT

A method to fabricate a high density, minimal pitch, thermally matched contactor assembly to maintain electrical contact with contact regions on fully processed semiconductors, preferably while still in wafer form, and throughout a range of temperatures. A guide plate and a contactor assembly for such use, comprising a substrate formed of a material having a coefficient of thermal expansion approximately equal to that of the device; and at least one hole in the guide plate for receiving an electrical contact (probe element) for contacting at least one respective region on said surface, said at least one hole being sized and shaped so as to accept said electrical contact, while allowing said electrical contact (probe element) to move with respect to said hole in said guide plate. The material can be one of silicon, borosilicate glass and cordierite.

20 Claims, 6 Drawing Sheets

METHOD FOR PRODUCING THERMALLY MATCHED PROBE ASSEMBLY

BACKGROUND OF THE INVENTION

1. Field of the Invention

The present invention relates to apparatus for performing tests on semiconductor devices. More particularly, it relates to probes for making electrical contact with semiconductor devices, and for methods for manufacturing such probes. More specifically, the present invention relates to methods for fabricating members for supporting probe contacts for probes used over a temperature range.

2. Background Art

In the manufacture of semiconductor devices, an electrical test is performed to determine functional performance of the device at the wafer level after all process steps are completed. This test is performed by mechanically contacting the wafer at precise locations on the wafer (known hereinafter as devices or dies). Within the die, specific locations for contacting are also known as interconnect pads. There are two major types of pads, wirebond and C4 (Controlled Collapse Chip Connection).

The current method of performing electrical performance testing in final wafer form is either test a single device at a time or where possible, to decrease cost of test, devices are tested in parallel using a multiplexing system within the tester. This test is performed at several different temperatures to uncover defects that are temperature sensitive. Contacting the device is accomplished by means of a mechanical probe consisting of an upper plate, a probe housing, a lower plate, and a plurality of generally flexible metal probes extending from the lower plate. A space transformer, as described in for example, U.S. Patent Application Publication No. 20060046529 of McKnight et al., may be used to interface the probe to a testing system.

When devices are subjected to a temperature other than what the probe was designed for, i.e. ambient temperature range, and the DUT (Device Under Test) is subjected to a temperature other than this, the DUT in wafer form expands and/or contracts at a rate different than the probe does. If this rate of expansion is greater than the allowable tolerance of the interconnect contact area of the C4 or wire bond pad, the probe will loose electrical contact with the contact area and give erroneous data, indicating that the device has failed when in fact it is potentially a good, working device. There are three major issues which further aggravate this situation:

1. Multi-DUT testing—testing several devices in parallel for cost reductions during test.
2. Temperature extremes changing from −40 to 150° C.
3. Pad geometry shrinking for both wire bond and C4 applications Multi-DUT sample configurations can be fabricated in many different configurations. One other version not shown is "skip die" where adjacent die are "skipped" to provide adequate trace routing (space transformation) for the interconnection to the test system.

The most common materials used for lower guide plates is Delrin®, a Dupont polymer and Macor® a Corning machinable (alumina) ceramic. Both materials have the advantages and disadvantages. Delrin has good wear properties, low coefficient of friction but has limited temperature range and nearly two times the thermal expansion coefficient of Macor ceramic. Macor ceramic has very wide temperature range of use and about half the thermal expansion characteristics, but is abrasive and must be coated to prevent chafing of the shaft of the probe contacts. The traditional way around this is to build the lower probe die somewhere near the mid temperature range, therefore cutting the error in half.

For a 50 mm die (assuming a multi-DUT application) for 100° C., the thermal offset is about 1.4 mils. That means if the outer probes are off center a maximum of that amount, the minimum offset would be half that amount (0.7 mils), assuming an even expansion rate from the center. If a Multi-DUT probe is used for testing wirebond pad or C4 solder bump and the contact area is relatively small compared to the amount of thermal offset, electrical contact will not be made, and thus the device will be labeled as a fail, and discarded. The other problem with this is it will limit the overall size of the Multi-DUT probe to stay within the contact area. Another method which avoids this problem, is to build separate probe sets for different temperature extremes. This method is costly and lowers throughput on the test system because of the added setup time.

SUMMARY OF THE INVENTION

It is an object of the invention to provide a method for fabrication of a probe contact guide that has a coefficient of thermal expansion which is close to that of the material of a device under test.

It is a further object of the invention to provide such a probe contact guide.

It is another object of the invention to provide a probe contact guide having various geometries for receiving probe contacts.

In accordance with the invention, the lower guide plate in a probe has a thermal expansion rate substantially equal to the product silicon, i.e., silicon, borosilicate (glass), and cordierite that will work across the entire temperature range.

These objects and others are achieved in accordance with the invention by a method for forming a guide plate for at least one contact for contacting regions on a surface of a semiconductor device to be tested, comprising forming of a material having a coefficient of thermal expansion approximately equal to that of the device, at least one hole in the guide plate for receiving an electrical contact for contacting at least one respective region on the surface, the at least one hole being sized and shaped so as to accept the electrical contact, while allowing the electrical contact to move with respect to the hole in the guide plate.

The guide plate can be formed by a process comprising machining the guide plate to provide regions for supporting the guide plate to a housing; forming a central recessed region in a first side of the guide plate; forming at least one blind hole in the central recessed region by plasma etching; and processing a second side of the guide plate opposite to the first side of the guide plate until the hole is exposed at the second side.

The material can be silicon and the plasma etching can comprise using a deep silicon reactive ion etching process.

The method can further comprising forming an insulating layer in the central recessed region. The insulating layer can be formed after forming the blind hole.

The forming of the hole can comprise masking the guide plate with a mask, the mask having a respective opening corresponding to each hole; etching the at least one hole through a respective opening; and forming a chamfer about the periphery of the at least one hole.

The at least one hole can be formed to have a cross-section which is one of circular, elliptical, square, rectangular and hexagonal. The hole can be formed to have a lengthwise profile which is one of vertical, retrograde, bowed or barreled, or sloped. The at least one hole can be formed with slots along its length for accepting the electrical contact.

The coefficient of thermal expansion of the material is selected to be within substantially ten percent of that of the semiconductor device. In general the material is one of silicon, borosilicate glass and cordierite.

The invention is also directed to a guide plate for at least one contact for contacting regions on a surface of a semiconductor device to be tested, comprising a substrate formed form a material having a coefficient of thermal expansion approximately equal to that of the device; and at least one hole in the guide plate for receiving an electrical contact for contacting at least one respective region on the surface, the at least one hole being sized and shaped so as to accept the electrical contact, while allowing the electrical contact to move with respect to the hole in the guide plate.

The guide plate can further comprise regions for supporting the guide plate to a housing; and a central recessed region in a first side of the guide plate; the at least one hole in the central recessed region; and the hole extending to a second side of the guide plate opposite to the first side of the guide plate so that the hole is exposed at the second side.

When the material is silicon, the guide plate can further comprise an insulating layer in the central recessed region.

The guide plate can further comprise a chamfer or fillet about the periphery of the at least one hole. The at least one hole may be formed to have a cross-section which is one of circular, elliptical, square, rectangular and hexagonal. The at least one hole is formed to have a lengthwise profile which is one of vertical, retrograde, bowed or barreled, or sloped. The at least one hole can be formed with slots along its length for accepting the electrical contact.

The coefficient of thermal expansion of the material is preferably selected to be within substantially ten per cent of that of the semiconductor device. In general, the material is one of silicon, borosilicate glass and cordierite.

The invention is also directed to the guide plate of in combination with an electrical contact for each of the at least one holes, a housing to which the guide plate is mounted, and a plurality of clips for attaching the guide plate to the housing.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENTS

While the invention may be practiced with a variety of materials, it is preferred that the materials used by silicon, borosilicate glass, cordierite ($MgAl_2O_4SiO_2$), or any other material known to one skill in the art to be useful. A key requirement for the material is that the thermal coefficeint of expansion (TCE) be matched to that of silicon within +/−10%.

Figure 1A:
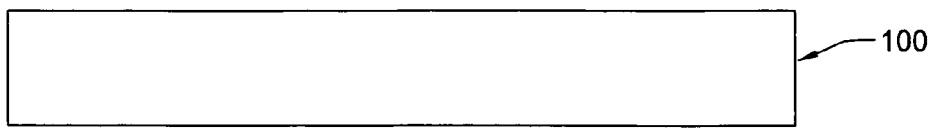
FIG. 1A to FIG. 1F are enlarged, cross-sectional views of successive steps in the formation of a silicon lower guide plate for a probe assembly in accordance with the invention.
Figure 1B:
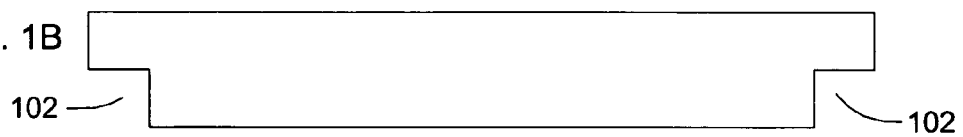
Figure 1C:
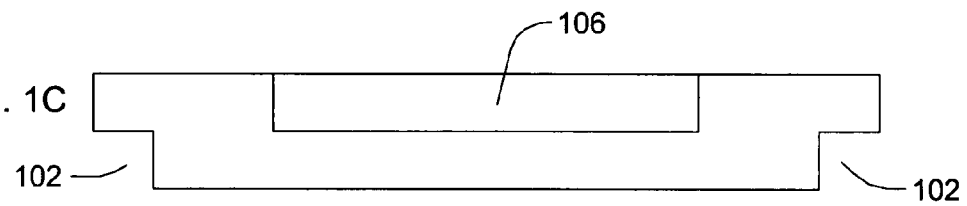
Figure 1D:
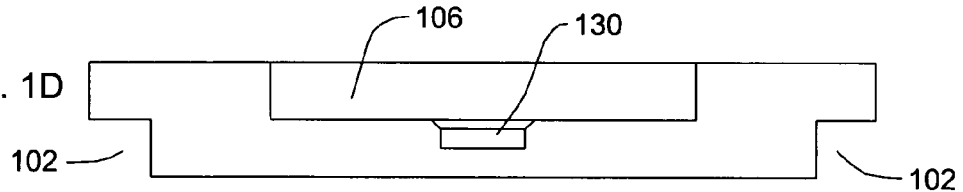

Referring to FIGS. 1A to 1F, in one preferred embodiment, the material for the probe guide is silicon. In this embodiment, the probe may be manufactured as follows. In FIG. 1A, a slab of silicon which for the substrate 100 for the lower plate or probe guide is illustrated. Substrate 100 is machined in a conventional manner to its overall size. In FIG. 1B, the material of the substrate 100 is milled at 102 to allow for contact of a spring clamp or clips 306, as further described with respect to FIG. 3. In FIG. 1C, a recess or cavity 106 is fabricated, either using mechanical milling or with an etching process, either utilizing a wet chemical etch or a dry (plasma) etch. FIG. 1D, illustrates the first step in the fabrication of a hole 130, preferably by plasma etching, within the probe guide material. The fabrication of hole 130 is described in more detail below with respect to FIG. 4A to 4D.

Figure 1E:
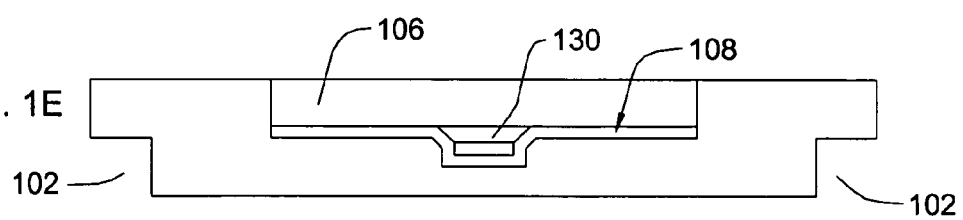
Figure 1F:
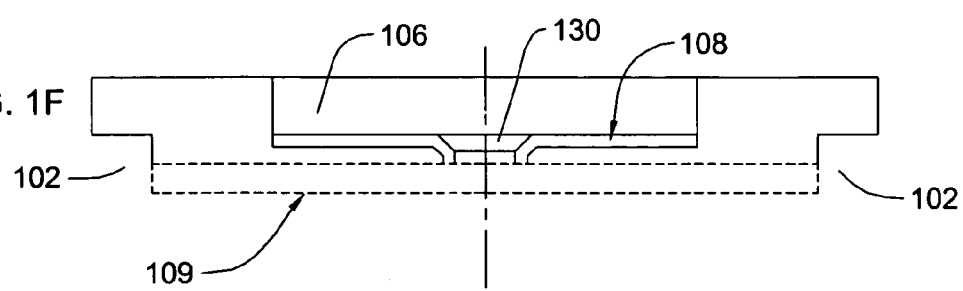

Referring to FIG. 1E, the probe guide is subjected to deposition of an insulator 108, which is preferably an oxide having a thickness of approximately 5-10 thousand Å, on the lower surface of cavity 106. The insulator may be deposited by PECVD, LPCVD, ALD, PVD, thermal growth, or any method known to one skilled in the art to be useful. Referring to FIG. 1F, the bottom surface 109 of the substrate is recessed back by mechanical milling, wet (chemical) etch or dry (plasma) etch to reveal the bottom of hole 130. Optionally, thermal stress is then relieved by annealing at a temperature between 100° C. and 1000° C. for a time between 1 and 100 minutes in an ambient of nitrogen or forming gas. Preferentially, the silicon is annealed at 250° C. for 30 minutes in forming gas (a mixture of nitrogen and dilute hydrogen (up to approximately ten percent hydrogen, with a preferred concentration of four percent hydrogen)).

Figure 2A:
FIG. 2A to FIG. 2E are enlarged, cross-sectional views of successive steps in the formation of a borosilicate lower guide plate for a probe assembly in accordance with the invention.
Figure 2B:
Figure 2C:
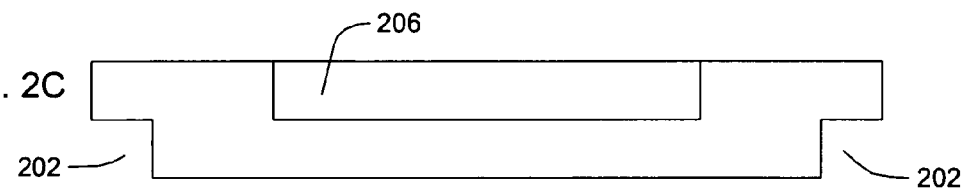
Figure 2D:
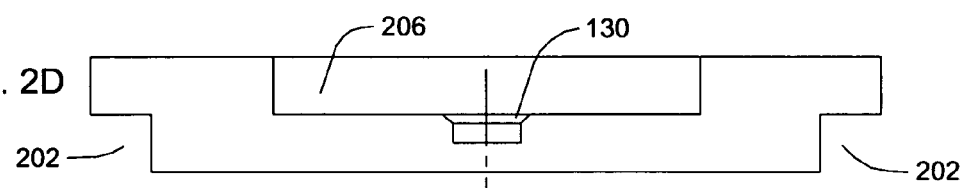

Referring to FIG. 2A, a substrate 200 of borosilicate glass is machined in a conventional manner to its overall size. In FIG. 2B, the material of the substrate 200 is milled at 202 to allow for contact of a spring clamp or clips 306, as further described with respect to FIG. 3. In FIG. 2C, a recess or cavity 206 is fabricated, preferably using a plasma etch process. FIG. 2D, illustrates the first step in the fabrication of a hole 130, preferably by plasma etching, within the probe guide material. The fabrication of hole 130 is described in more detail below with respect to FIG. 4A to 4D.

Figure 2E:
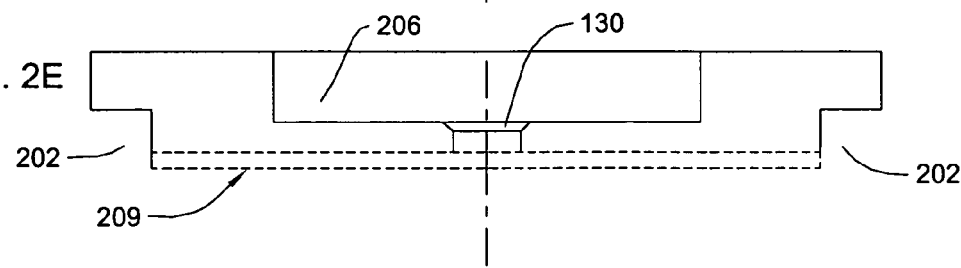

Referring to FIG. 2E, the bottom surface 209 of the substrate is recessed back by mechanical milling, wet (chemical) etch or dry (plasma) etch to reveal the bottom of hole 130. Optionally, thermal stress is then relieved by annealing at a temperature between 100° C. and 1000° C. for a time between 1 and 100 minutes in an ambient of nitrogen or forming gas. Preferentially, the silicon is annealed at 250° C. for 30 minutes in forming gas.

Figure 3:
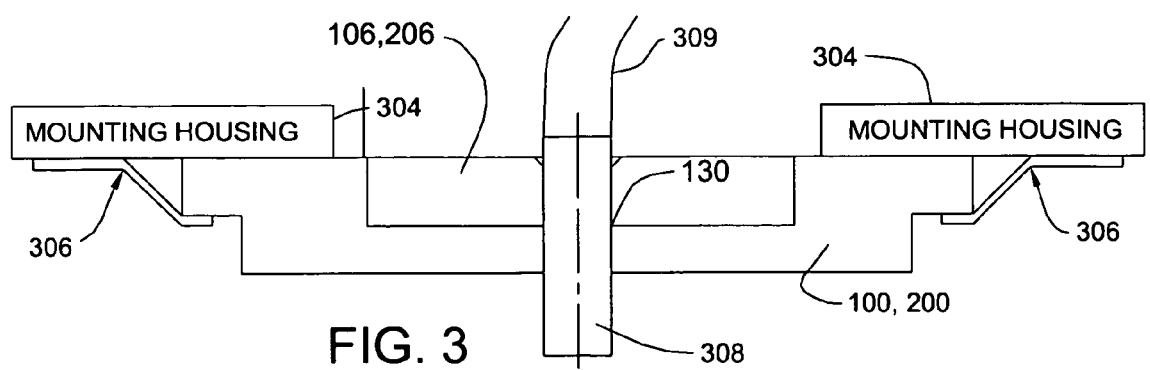
FIG. 3 is an enlarged cross-sectional view of a probe assembly in accordance with the invention, including the lower guide plate of FIG. 1F or the lower guide plate of FIG. 2E, and a single contact probe, for simplicity of illustration.

Referring to FIG. 3, the completed lower guide plate or substrate 100 or 200 is secured to a mounting housing 304, by clips 306. A resilient conductive probe contact 308, of a type well know in the art, is received in each hole 130, and is connected to electronic test equipment by an electrical conductor 309, as is known to one skilled in the art.

Figure 4A:
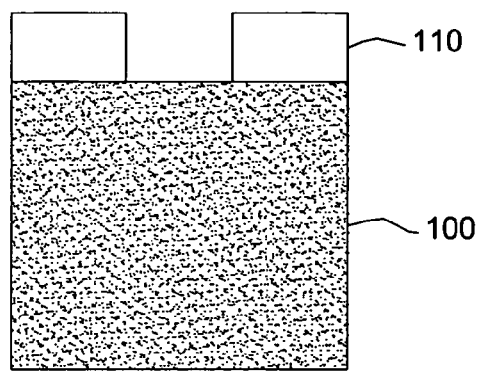
FIG. 4A to FIG. 4D are enlarged cross-sectional views illustrating a method for fabricating holes for probe contacts of the probe assemblies.
Figure 4B:
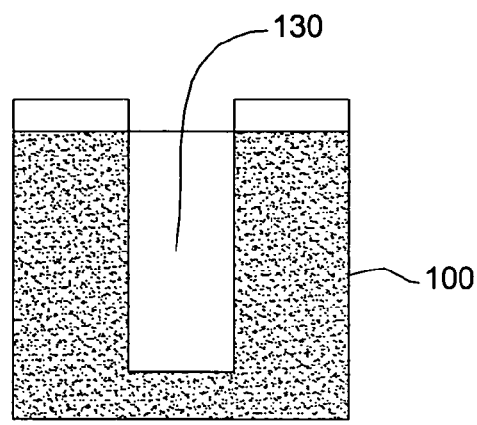
Figure 4C:
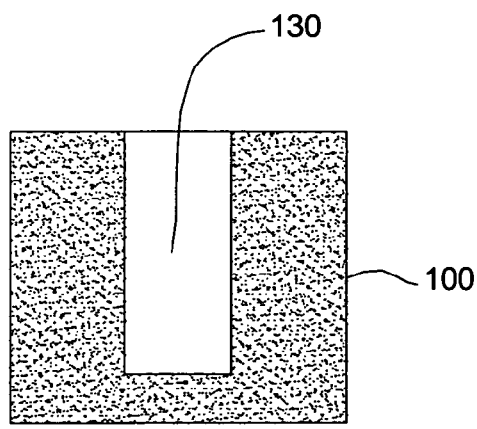
Figure 4D:
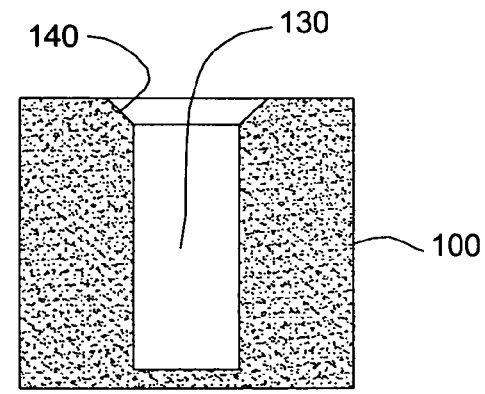

Referring to FIG. 4A, substrate 100 is masked with mask 110. Masks 110 may be a conventional material such as a photoresist, or it may be a multilayer structure consisting of both a conventional softmask material such as photoresist and a hardmask material such as silicon dioxide, silicon nitride, aluminum oxide, aluminum, or any other material known to one skilled in the arts to be useful as a masking material. In the preferred embodiment, the mask is both photoresist and silicon dioxide. In FIG. 4B cavity or hole 130 is formed within substrate 100. A preferred method for fabricating cavity or hole 130 within substrate 100 is with a deep silicon reactive ion etching (RIE) process. Such processes can be accomplished with commercially available, deep RIE systems such as the A601E, available from Alcatel of Annecy, France. The deep RIE method uses time-multiplexed etching (TMDE), a variation of sidewall passivation, wherein etching and deposition cycles are performed sequentially in an alternating methodology. During the deposition step, sidewalls are passivated by a polymer deposited from a plasma, formed from the deposition precursor. During the subsequent etching cycle, both the polymer and the silicon are preferentially etched from the bottom of the cavity or hole 130 by ion bombardment. By switching between etching and deposition cycles, deep, anisotropic structures having vertical sidewalls can be realized with very high etching rates in silicon substrates. This process is taught by Laermer and Schilp in U.S. Pat. No. 5,501,893 assigned to Robert Bosch Gmbh., which is incorporated herein by reference in its entirety. With the silicon substrate 100 for the presently preferred embodiment, deep silicon etching is accomplished using an etching cycle flowing $SF_6$ and a deposition cycle flowing $C_4F_8$, as is known in the art. Typical process recipes use etchant flows between 300 sccm and 900 sccm and more preferably 750 sccm. Passivant flows can be between 50 sccm and 150 sccm and more preferably 110 sccm. The duration of the etching cycle is between 3 seconds and 12 seconds and more preferably 9 seconds. The duration of the deposition cycle is between 1 second and 4 seconds and more preferably 2.5 seconds. The chamber pressure can range between 5 mTorr to 15 mTorr during the deposition step and more preferably between 8 mTorr and 12 mTorr. The chamber pressure can range between 35 mTorr and 85 mTorr during the etching step and more preferably between 55 mTorr and 75 mTorr. Power is independently applied to the inductively coupled plasma (ICP) source and capacitively coupled plasma (CCP) bias generators. The applied source power can be between 1000 W and 3000 W and more preferably 2000 W. Substrate bias can range between 50 W and 225 W and more preferably 200 W. After cavity or hole 130 is formed, mask 110 is removed from substrate 100. Finally, an optional step is shown in FIG. 4D. During this optional step, the top of cavity or hole 130 can be chamfered or faceted to form chamfers 140. The chamfer is formed utilizing a plasma etching (RIE) process. The process can employ a halogen etching species (i.e. fluorine, chlorine, bromine, or iodine). The preference is for chlorine, bromine, or a mix of the two. Fluorine generally is not preferred due to its isotropic etching of silicon, while iodine generally is not preferred due to the difficulty of effectively delivering the etchant into a reaction chamber. A preferred chamfering process is performed on a Lam 9400 etching system at a pressure of 10 mTorr with a flow of chlorine of 100 sccm and HBr of 100 sccm with source power of 300 W and a bias power of 100 W.

Figure 5:
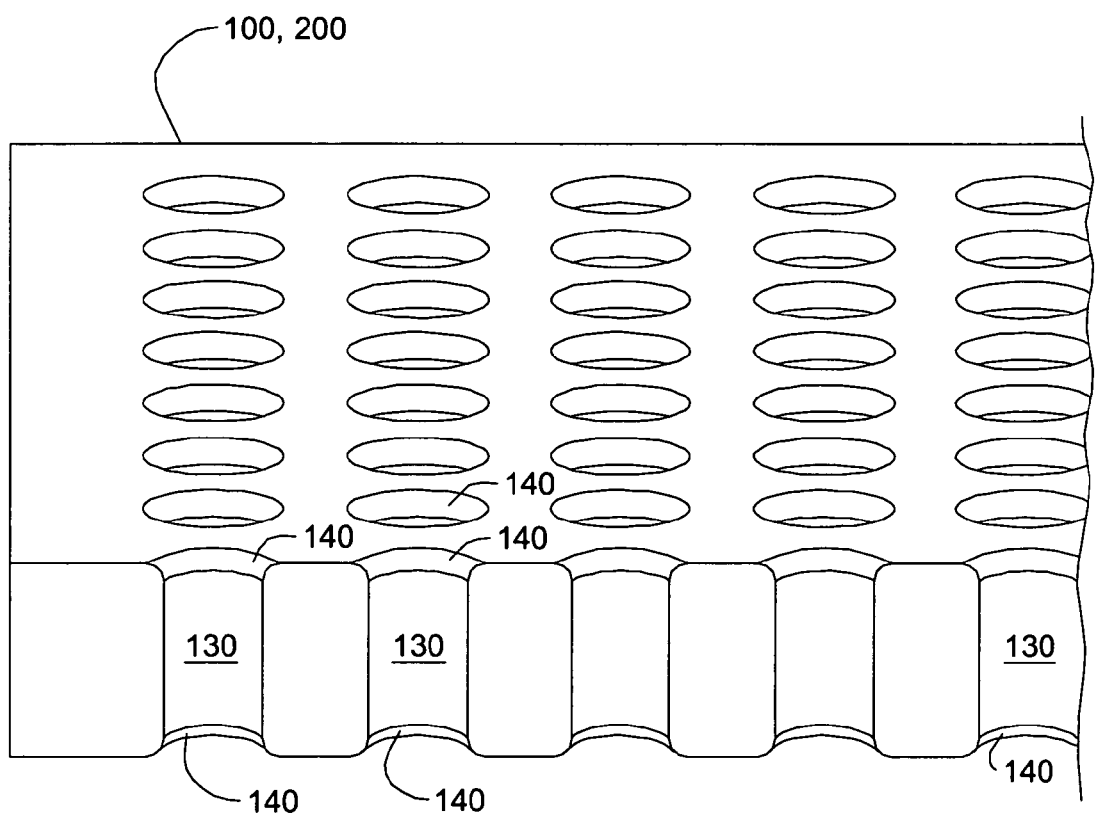
FIG. 5 is a perspective view the manner in which a radius may be formed on a chamfer in a hole for a probe contact.

While chamfer 140 is shown as linear in FIG. 4D, it may be fabricated of an arbitrary shape, such as having a radius as shown in FIG. 5. In FIG. 5 a substrate 100,200 has an array of holes 130 formed therein, with one row of hole 130 being shown in cross-section, with a fillet or chamfer 140 also being illustrated. The advantage of a radius being formed on chamfer 140 is that chaffing (wear) at the hole top or bottom is prevented or reduced when the probe contact slides through the guide die, thus providing compliance, which in turn assures constant force on the DUT (device Under Test) on a per contact basis.

Figure 6A:
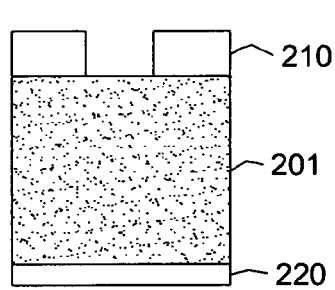
FIG. 6A to FIG. 6F are enlarged cross-sectional views illustrating an alternative method for fabricating holes for probe contacts of the probe assemblies.
Figure 6B:
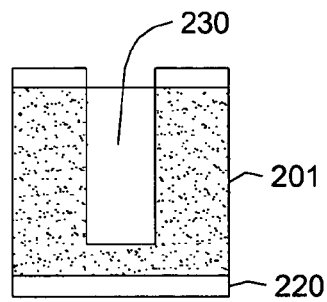
Figure 6C:
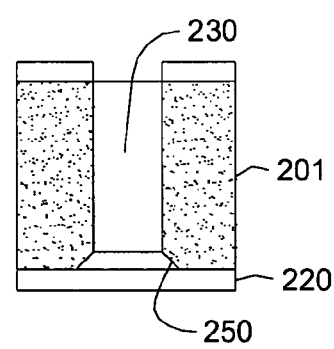
Figure 6D:
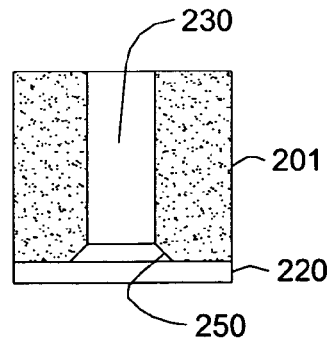
Figure 6E:
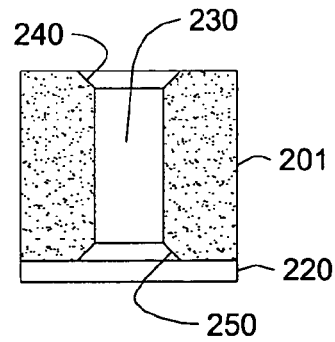
Figure 6F:
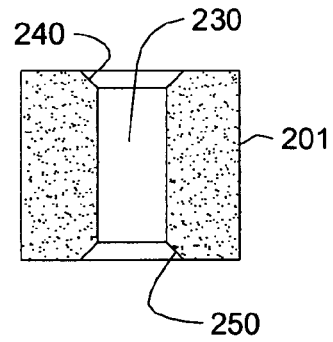

FIGS. 6A to 6F illustrate an alternate method for forming holes for the probe contacts. In FIG. 6A, a substrate 201 is masked by mask 210 and is also bounded on the lower end by stopping layer 220. In FIG. 6B, cavity or hole 230 is formed within substrate 201. Cavity 230 ends on stopping layer 220. As illustrated in FIG. 6C, allowing the etch to proceed past the landing results in the generation of bottom notches 250. In FIG. 6D, masking layer 210 is removed. Then, in FIG. 6E, top chamfers 240 are formed. Finally, stopping layer 220 may be removed. It is recognized that top chamfer 240 and bottom notch 250 may be of an arbitrary shape such as a radius, as shown in FIG. 5.

Figure 7A:
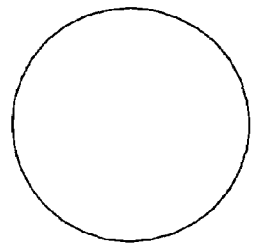
FIG. 7A to FIG. 7F are enlarged cross-sectional views illustrating various cross-section geometries for the holes for the probe contacts.
Figure 7B:
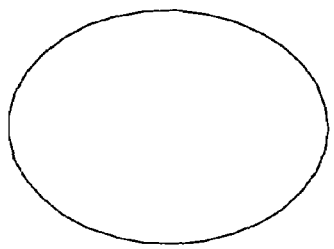
Figure 7C:
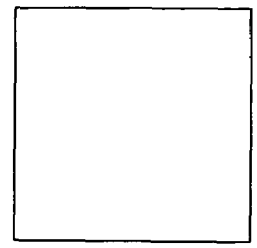
Figure 7D:
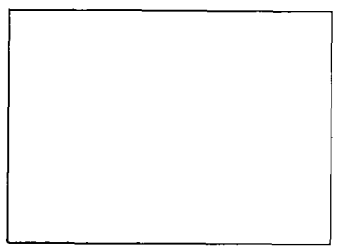
Figure 7E:
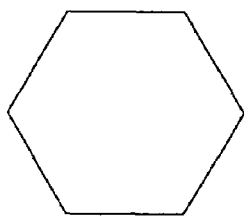
Figure 7F:
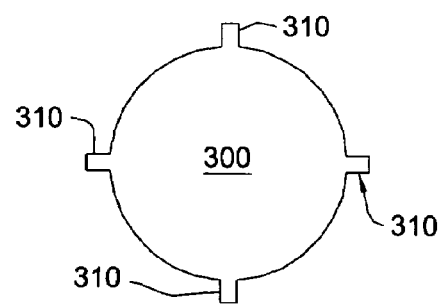

It should be recognized that cavities or holes 130,230 may be of any arbitrary cross-sectional shape. Examples of these shapes are shown in FIGS. 7A to 7E, and include in sequence circular, elliptical, square, rectangular and hexagonal. These examples are meant to be illustrative and not limiting. FIG. 7F illustrates an important optional feature, which is the presence of guide slots 310 within a probe hole 300. Guide slots 310 may aid in orienting the placement of a probe contact within the probe hole 300. The formation of guide slots 310 may be facilitated by appropriate corresponding features in the etching masks used to form cavities or holes 130,230. It should also be recognized that while a single hole or cavity 130, 230 is shown in FIGS. 6A-F and 7A-F, a plurality of holes or cavities 130, 230 are produced on the inventive structure. Furthermore, it should be recognized that the hole shapes 7A-F are not mutually exclusive on a single substrate made in accordance with the invention; that is a single substrate may have holes of different shapes.

Figure 8:
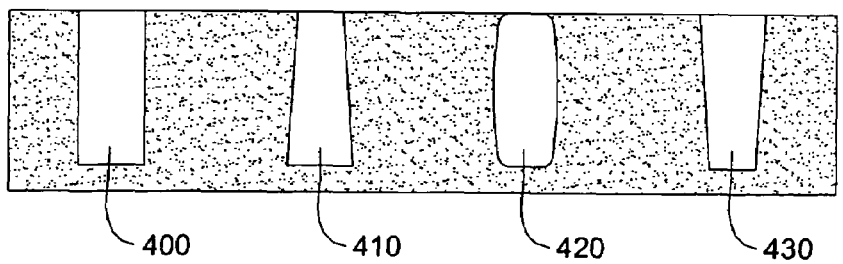
FIG. 8 illustrates enlarged cross-sectional views of various geometries for the lengthwise profiles for holes for the probe contacts.

FIG. 8 illustrates enlarged cross-sectional views of various geometries for the lengthwise profiles for cavities or holes 130,230 for the probe contacts through the depth of substrates 100,200. The cavities or holes 130, 230 may be substantially vertical 400, retrograde 410, bowed or barreled 420, or sloped 430. Again, these examples are meant to be illustrative and not limiting. The preferred shape is substantially vertical 400.

Although only a single probe contact 208 has been illustrated, it will be understood that generally a plurality of probe contacts will be present (as illustrated by, for example, contacts 18 of FIG. 1 of United States Patent Publication No. 20060046529 of McKnight et al.), each contact extending through one of a corresponding hole in the guide plate. The teachings of United States Patent Publication No. 20060046529 are hereby incorporated by reference in their entirety.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for forming a guide plate for at least one contact for contacting regions on a surface of a semiconductor device to be tested, comprising:

forming of a material having a coefficient of thermal expansion approximately equal to that of the device, at least one hole in the guide plate for receiving an electrical contact for contacting at least one respective region on said surface, said at least one hole being sized and shaped so as to accept said electrical contact, while allowing said electrical contact to move with respect to said hole in said guide plate; said at least one hole being formed by:

applying a mask to a first side of said guide plate, said mask having an opening for defining said at least one hole;

applying an etch stopping layer to a second side of said guide plate;

etching, from said first side of said guide plate, said at least one hole through the opening in the mask so that a notch region is formed in said guide plate at said stopping layer to define a chamfer having a dimension larger than a dimension of said opening in said mask;

removing said mask;

forming a chamfer of said at least one hole at the first side of said guide plate; and removing said etch stopping layer to expose said at least one hole at said second side of said guide plate.

2. The method of claim 1, wherein said guide plate is formed by a process further comprising:

machining the guide plate to provide regions for supporting said guide plate to a housing;

forming a central recessed region in a first side of said guide plate;

forming said at least one hole in said central recessed region by plasma etching.

3. The method of claim 2, wherein said material is silicon and said plasma etching comprises using a deep silicon reactive ion etching process.

4. The method of claim 3, further comprising forming an insulating layer in said central recessed region.

5. The method of claim 4, wherein said insulating layer is formed after forming said blind hole.

6. The method of claim 1, wherein said at least one hole is formed to have a cross-section which is one of circular, elliptical, square, rectangular and hexagonal.

7. The method of claim 1, wherein said at least one hole is formed to have a lengthwise profile which is one of vertical, retrograde, bowed or barreled, or sloped.

8. The method of claim 1, wherein said at least one hole is formed with slots along its length for accepting said electrical contact.

9. The method of claim 1, wherein the coefficient of thermal expansion of said material is selected to be within substantially ten percent of that of said semiconductor device.

10. The method of claim 1, wherein said material is one of silicon, borosilicate glass and cordierite.

11. A method for forming a guide plate for at least one contact for contacting regions on a surface of a semiconductor device to be tested, comprising:

forming of a material having a coefficient of thermal expansion approximately equal to that of the device, at least one hole in the guide plate for receiving an electrical contact for contacting at least one respective region on said surface, said at least one hole being sized and shaped so as to accept said electrical contact, while allowing said electrical contact to move with respect to said hole in said guide plate; wherein said at least one hole is formed by:

masking said guide plate with a mask, said mask having a respective opening corresponding to each said at least one hole;

etching the at least one hole through a respective opening; and forming a chamfer having a radius about the periphery of said at least one hole.

12. The method of claim 11, wherein said guide plate is formed by a process comprising:

machining the guide plate to provide regions for supporting said guide plate to a housing;

forming a central recessed region in a first side of said guide plate;

forming at least one blind hole in said central recessed region by plasma etching; and processing a second side of said guide plate opposite to said first side of said guide plate until said hole is exposed at said second side.

13. The method of claim 12, wherein said material is silicon and said plasma etching comprises using a deep silicon reactive ion etching process.

14. The method of claim 13, further comprising forming an insulating layer in said central recessed region.

15. The method of claim 14, wherein said insulating layer is formed after forming said blind hole.

16. The method of claim 11, wherein said at least one hole is formed to have a cross-section which is one of circular, elliptical, square, rectangular and hexagonal.

17. The method of claim 11, wherein said at least one hole is formed to have a lengthwise profile which is one of vertical, retrograde, bowed or barreled, or sloped.

18. The method of claim 11, wherein said at least one hole is formed with slots along its length for accepting said electrical contact.

19. The method of claim 11, wherein the coefficient of thermal expansion of said material is selected to be within substantially ten percent of that of said semiconductor device.

20. The method of claim 11, wherein said material is one of silicon, borosilicate glass and cordierite.

* * * * *